(12) United States Patent  
Grewal

(10) Patent No.: US 7,388,283 B2
(45) Date of Patent: Jun. 17, 2008

(54) METHOD AND DEVICE FOR INTEGRATING AN ILLUMINATION SOURCE AND DETECTOR INTO THE SAME IC PACKAGE THAT ALLOWS ANGULAR ILLUMINATION WITH A COMMON PLANAR LEADFRAME

(75) Inventor: Roopinder S. Grewal, San Jose, CA (US)

(73) Assignee: Avago Technologies ECBU IP Pte Ltd, Singapore (SG)

( * ) Notice: Subject to any disclaimer, the term of this patent is extended or adjusted under 35 U.S.C. 154(b) by 69 days.

(21) Appl. No.: 11/051,108

(22) Filed: Feb. 4, 2005

(65) Prior Publication Data

US 2006/0175687 A1    Aug. 10, 2006

(51) Int. Cl.
*H01L 23/495*    (2006.01)
(52) U.S. Cl. .................. 257/692; 257/666; 257/670; 257/786
(58) Field of Classification Search ............. 257/692, 257/666, 670, 786
See application file for complete search history.

(56) References Cited

U.S. PATENT DOCUMENTS

| 5,245,214 | A  | * | 9/1993 | Simpson ................. 257/666 |
| 5,420,758 | A  | * | 5/1995 | Liang .................... 361/813 |
| 5,453,638 | A  | * | 9/1995 | Nagele et al. ............. 257/414 |
| 6,265,762 | B1 | * | 7/2001 | Tanaka et al. ............ 257/676 |
| 6,398,252 | B1 | * | 6/2002 | Ishikawa et al. .......... 280/727 |
| 6,909,179 | B2 | * | 6/2005 | Tanaka et al. ............ 257/734 |
| 7,042,068 | B2 | * | 5/2006 | Ahn et al. ............... 257/666 |
| 2003/0063476 | A1 | * | 4/2003 | English et al. ............ 362/545 |
| 2005/0087847 | A1 | * | 4/2005 | Kuan et al. ............... 257/666 |
| 2005/0264531 | A1 | * | 12/2005 | Tai et al. ................ 345/163 |
| 2005/0270666 | A1 | * | 12/2005 | Loh et al. ................ 359/726 |
| 2006/0045530 | A1 | * | 3/2006 | Lim et al. ................ 398/135 |

* cited by examiner

*Primary Examiner*—Long Pham

(57) ABSTRACT

An optical navigation device includes an integrated package. The integrated package includes a planar leadframe, a light source die mounted on the leadframe, and a sensor die mounted on the leadframe to be coplanar with the light source die. The integrated package may be mounted at an angle or parallel to a navigation surface. The sensor die may be mounted at a distance from the light source die to detect specular or scattered reflection. The optical navigation device may be devoid of any optical element used to manipulate light generated by the light source die.

18 Claims, 3 Drawing Sheets

METHOD AND DEVICE FOR INTEGRATING AN ILLUMINATION SOURCE AND DETECTOR INTO THE SAME IC PACKAGE THAT ALLOWS ANGULAR ILLUMINATION WITH A COMMON PLANAR LEADFRAME

DESCRIPTION OF RELATED ART

The leadframe is the "skeleton" of the integrated circuit (IC) package that provides mechanical support to the die during its assembly into a finished product. It consists of a die paddle to which the die is attached, and leads that serve as the means for external electrical connection to the outside world. The die is connected to the leads by wire bonds.

A typical packaging process starts when a die is attached to the leadframe using an adhesive. An automatic wire bonding tool connects the pads on the die to the leads on the leadframe with wire bonds. The whole assembly is then encapsulated in a block of plastic or epoxy. The unused parts of the leadframe are cut away and the device's leads, or pins, are shaped as required.

In optical navigation devices based on a light emitting diode (LED) light source, the concept of an integrated package involves the sensor die and the LED die being attached on the same planar leadframe. The leadframe is kept parallel to the navigation surface. An optical element, typically a total internal reflection (TIR) face, is used to bend the light to the desired angle of illumination with respect to the navigation surface.

In optical navigation devices based on a laser light source (e.g., a vertical cavity surface-emitting laser), the optical element could reduce the integrity of the laser beam. This is because to reduce cost, the optical element would be a molded plastic such as polycarbonate. The molding process probably cannot maintain the optical flatness that is necessary for the TIR face to maintain the integrity of the wavefront of the laser beam.

Thus, what is needed is a method to make an integrated package for optical navigation devices based on a laser light source.

SUMMARY

In one embodiment of the invention, an optical navigation device includes an integrated package. The integrated package includes a planar leadframe, a light source die mounted on the leadframe, and a sensor die mounted on the leadframe to be coplanar with the light source die. The integrated package may be mounted at an angle or parallel to a navigation surface. The sensor die may be mounted at a distance from the light source die to detect specular or scattered reflection. The optical navigation device may be devoid of any optical element used to manipulate light generated by the light source die.

BRIEF DESCRIPTION OF THE DRAWINGS

Use of the same reference numbers in different figures indicates similar or identical elements.

DETAILED DESCRIPTION

Figure 1:
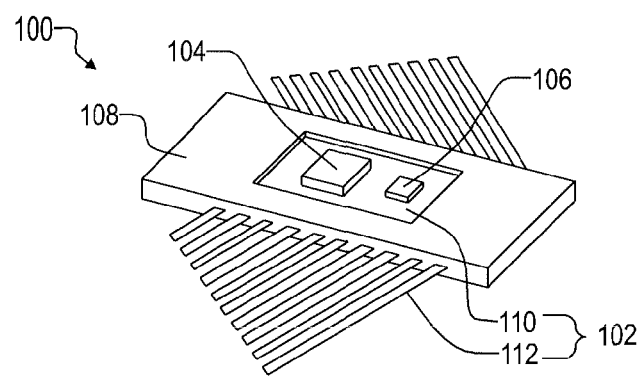
FIGS. 1 and 2 illustrate perspective and top views of an integrated package for an optical navigation engine in one embodiment of the invention.
Figure 2:
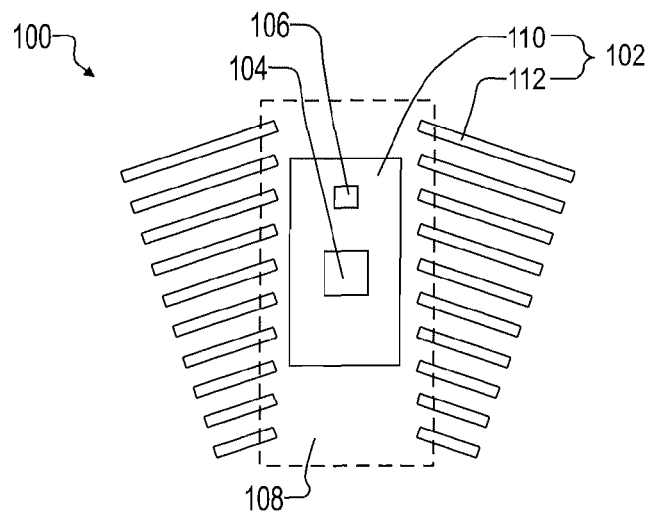

FIGS. 1 and 2 illustrate an integrated package 100 of an optical navigation engine in one embodiment of the invention. Integrated package 100 includes a leadframe 102, a sensor die 104, a light source die 106, and a package molding 108.

Leadframe 102 includes a planar lead paddle 110 and leads 112 (only one is labeled for clarity). The lengths of leads 112 increase along the length of lead paddle 110. Depending on the embodiment, leads 112 can be angled or orthogonal to the sides of lead paddle 110. Sensor die 104 includes integrated circuits for capturing optical images and determining motion from the captured images. Light source die 106 may be a light emitting diode (LED) or a laser, such as a vertical cavity surface-emitting laser (VCSEL).

In one embodiment, the manufacturing process of integrated package 100 is as follows. Leadframe 102 is stamped and then insert molded to form package molding 108. Package molding 108 may include a baffle 109 to prevent light from light source die 106 from reaching sensor die 104. A silver epoxy is dispensed on lead paddle 110 and sensor die 104 and light source die 106 are mounted on lead paddle 110. Pads on dies 104 and 106 are then connected to leads 112 by wire bonds. A silicone encapsulation is optionally dispensed over dies 104 and 106. A lid 302 (shown in FIG. 3) is then mounted onto package molding 108 to enclose dies 104 and 106. Lid 302 defines apertures where light can exit and enter integrated package 100. Leads 112 are then bent downward for mounting integrated package 100 to a printed circuit board (PCB). The process is typically performed in parallel for multiple packages, which are singulated at the end to form individual packages.

Figure 3:
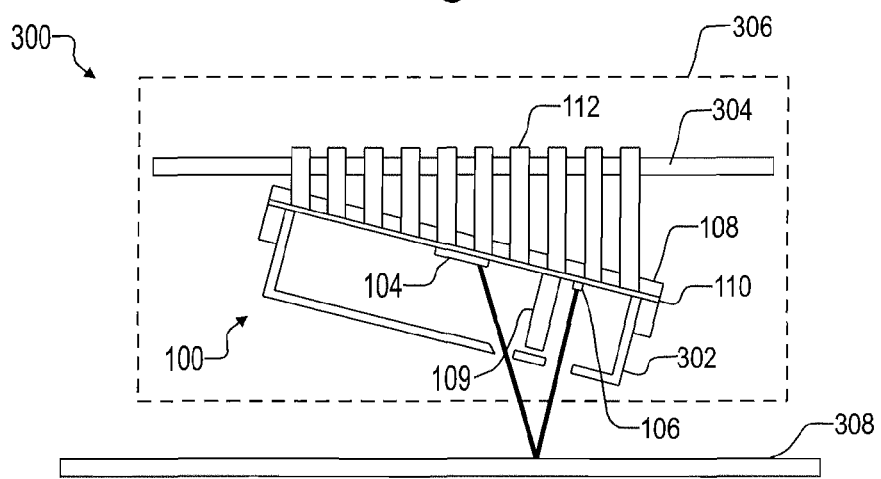
FIGS. 3, 4, 5, 6, and 7 illustrate optical navigation devices in embodiments of the invention.

FIG. 3 illustrates integrated packaged 100 assembled into an optical navigation device 300 (e.g., an optical mouse) in one embodiment of the invention. As leads 112 (only one is labeled for clarity) have incremental lengths, integrated package 100 is mounted at an angle to the bottom of a PCB 304. The mounting angle depends on the lengths of leads 112, which in turn depend on the desired angles of incidence and reflection with respect to a navigation surface 308. In one embodiment, the angles of incidence and reflection range from 20 to 30 degrees. PCB 304 is mounted to a housing 306 so it is parallel to navigation surface 308.

In the embodiment shown in FIG. 3, the lengths of leads 112 are selected so light source die 106 emits a light beam at an angle relative to navigation surface 308. Note that no optical element is used to bend the light beam relative to navigation surface 308. Instead, light source die 106 is oriented at an angle relative to navigation surface 308 by the way integrated package 100 is mounted onto PCB 304.

The light beam from light source die 106 reflects from navigation surface 308 at an angle. Sensor die 104 is located at a distance from light source die 106 on leadframe 102 so it can receive the reflected light. In this embodiment, sensor die 104 detects specular images in order to determine the motion of device 300. Note that motion can be determined from the images, whether specular or scattered, using specked based or non-speckle based techniques. In some embodiments, an imaging lens is provided between navigation surface 308 and sensor die 104.

Integrated package 100 offers many advantages. With incremental leads 112, material and assembly costs are reduced because no optical element is used to bend the light at the appropriate angle relative to navigation surface 308. Furthermore, assembly costs are reduced because incremental leads 112 allow dies 104 and 106 to be mounted on a planar lead paddle 110 using standard high volume manufacturing processes.

Figure 4:
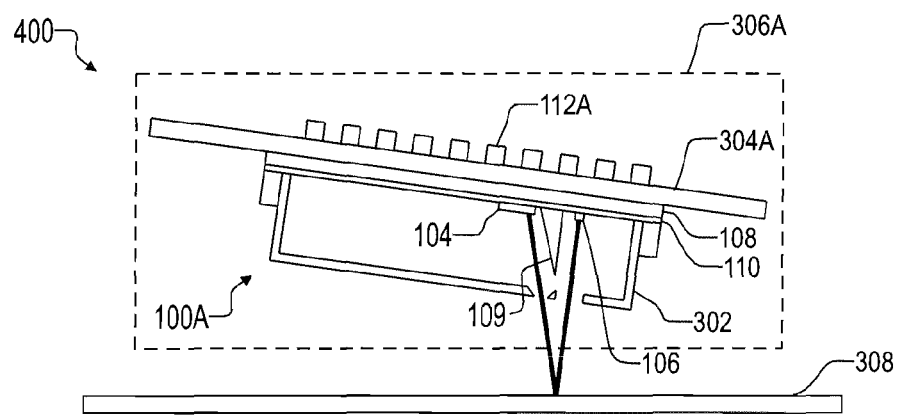

FIG. 4 illustrates a navigation device 400 with an integrated package 100A in one embodiment of the invention.

Device 400 is similar to device 300 except that leads 112A (only one is labeled for clarity) have uniform lengths and that PCB 304A is mounted to housing 306A at an angle. As leads 112A have uniform lengths, integrated package 100A is mounted parallel to PCB 304A. Thus, it is the angled mounting of PCB 304A that allows light source die 106 to emit the light beam at an angle relative to navigation surface 308. Again, no optical element is used to bend the light beam at an angle relative to navigation surface 308.

Figure 5:
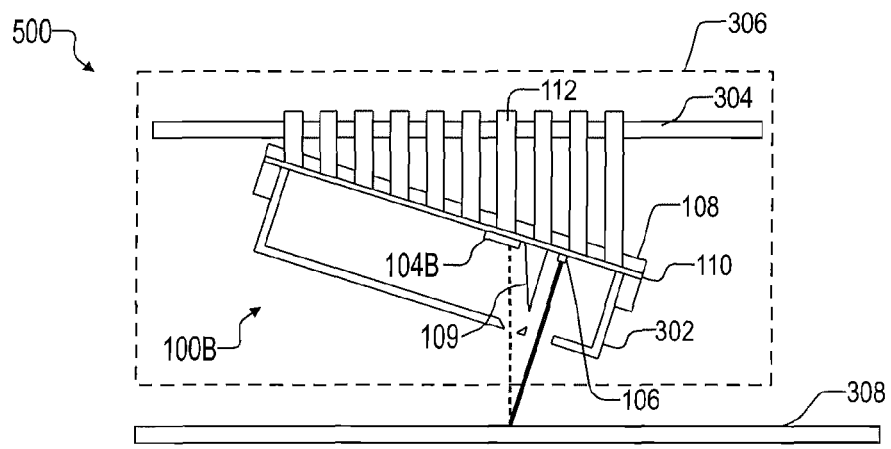

FIG. 5 illustrates a navigation device 500 with an integrated package 100B in one embodiment of the invention. Device 500 is similar to device 300 except that sensor die 104B is placed directly over the point where the light beam strikes navigation surface 308 in order to receive scattered light (shown as the dashed line). In this embodiment, sensor die 104B detects scattered light images in order to determine the motion of device 500. Note that motion can be determined from the images, whether specular or scattered, using specked-based or non-speckle based techniques. Again, no optical element is used to bend the light beam at an angle relative to navigation surface 308.

Figure 6:
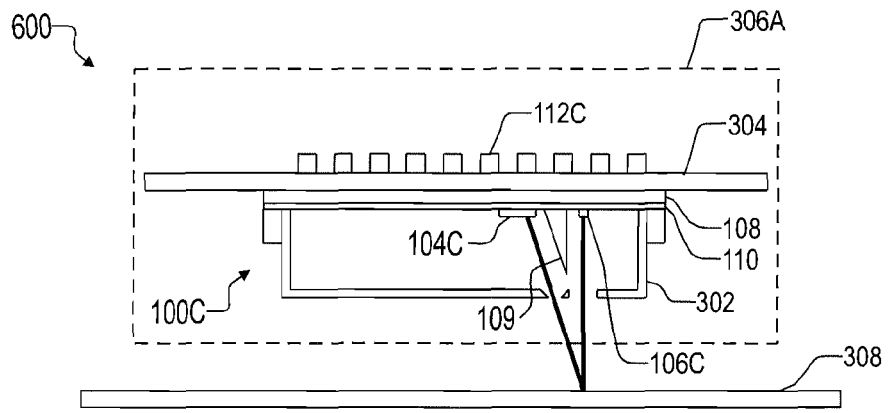

FIG. 6 illustrates a navigation device 600 with an integrated package 100C in one embodiment of the invention. Device 600 is similar to device 300 except that leads 112C have uniform lengths, light source die 106C emits a light beam orthogonally onto navigation surface 308, and sensor die 104C is located away from light source die 106C to receive scattered light (shown as the dashed line). In this embodiment, sensor die 104C detects scattered light images in order to determine the motion of device 600.

Figure 7:
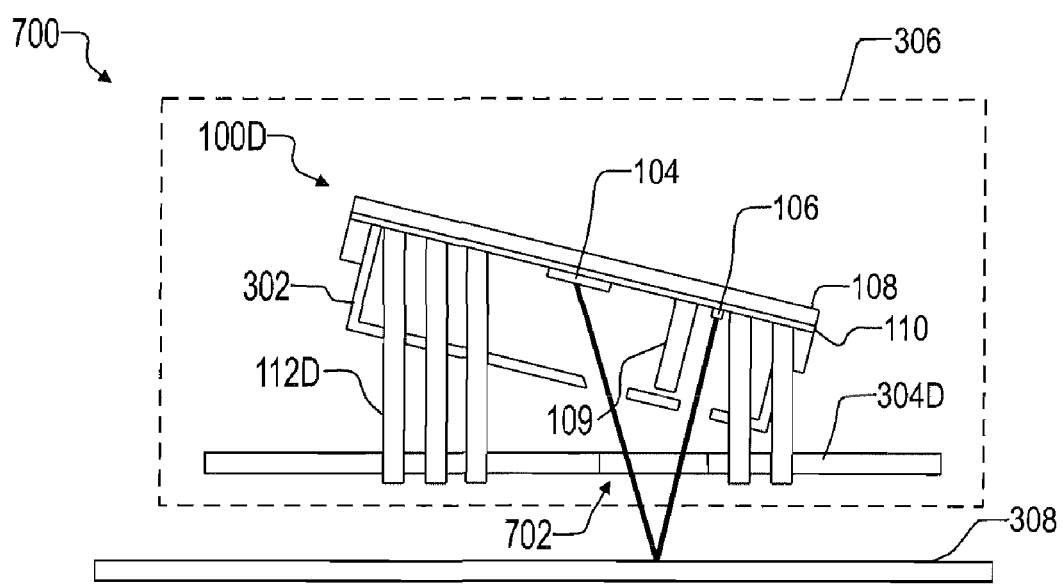

FIG. 7 illustrates a navigation device 700 with an integrated package 100D in one embodiment of the invention. Device 700 is similar to device 300 except that leads 112D (for clarity, only one is labeled and some are omitted) are bent upward so that integrated package 100D is mounted on top of PCB 304D. Furthermore, PCB 304D has an aperture 702 that allows the light to exit and reenter integrated package 100D. One skilled in the art understands that devices 400, 500, and 600 can be similarly modified so they are mounted on top of their PCB.

Various other adaptations and combinations of features of the embodiments disclosed are within the scope of the invention. Numerous embodiments are encompassed by the following claims.

What is claimed is:

1. An optical navigation device, comprising:
    an integrated package mounted at an angle with respect to a navigation surface so the integrated package is not parallel with the navigation surface, the integrated package comprising:
    a leadframe comprising a planar lead paddle;
    a light source die mounted on the lead paddle that emits light toward the navigation surface;
    a sensor die mounted on the lead paddle that receives light reflected from the navigation surface, wherein the light source die and the sensor die are coplanar on the lead paddle;
    wherein the optical navigation device is movable relative to the navigation surface;
    a printed circuit board (PCB) mounted parallel to the navigation surface, wherein the integrated package is mounted to the PCB at the angle; and
    wherein the leadframe comprises leads having outer ends that extend away in incrementing lengths and bend orthogonal to the lead paddle, the leadframe being mounted to the PCB with the leads.

2. The device of claim 1, wherein the integrated package is mounted to the bottom of the PCB.

3. The device of claim 1, wherein the sensor die is mounted at a distance from the light source die to detect a specular reflection or a scattered reflection from the navigation surface.

4. The device of claim 1, wherein the integrated package is devoid of any optical element for manipulating a light emitted by the light source die.

5. The device of claim 1, wherein the optical navigation device comprises an optical mouse.

6. A package for an optical navigation engine, comprising:
    a leadframe comprising a planar lead paddle;
    a light source die mounted on the lead paddle that emits light toward a navigation surface;
    a sensor die mounted on the lead paddle that receives light reflected from the navigation surface; and
    a baffle positioned between the light source die and the sensor die that prevents light emitted from the light source die from passing directly to the sensor die without first being reflected from the navigation surface; wherein:
    the light source die and the sensor die are coplanar on the lead paddle; and
    the package is movable relative to the navigation surface.

7. The package of claim 6, wherein the light source die comprises a laser die.

8. The package of claim 6, wherein the leadframe further comprises leads having outer ends that extend away in incrementing lengths and bend orthogonal to the lead paddle.

9. The package of claim 6, wherein the sensor die is mounted at a distance from the light source die to detect a specular reflection or a scattered reflection from the navigation surface.

10. An optical navigation device, comprising:
    an integrated package mounted parallel to a navigation surface, the integrated package comprising:
    a leadframe comprising a planar lead paddle;
    a light source die mounted on the lead paddle that emits light toward a navigation surface;
    a sensor die mounted on the lead paddle that receives light reflected from the navigation surface; and
    a baffle positioned between the light source die and the sensor die that prevents light emitted from the light source die from passing directly to the sensor die without first being reflected from the navigation surface; wherein:
    the light source die and the sensor die are coplanar on the lead paddle; and
    the integrated package is movable relative to the navigation surface.

11. The device of claim 10, wherein the light source die comprises a laser die.

12. The device of claim 10, further comprising:
    a printed circuit board (PCB) mounted parallel to the navigation surface, wherein the integrated package is mounted to the PCB.

13. The device of claim 12, wherein the integrated package is mounted to the bottom of the PCB.

14. The device of claim 10, wherein the integrated package is devoid of any optical element for manipulating a light emitted by the light source die.

15. The device of claim 10, wherein the optical navigation device comprises an optical mouse.

16. The device of claim 1, wherein the leads extend away at an angle prior to being bent orthogonal to the lead paddle.

17. The device of claim 8, wherein the leads extend away at an angle prior to being bent orthogonal to the lead paddle.

18. The device of claim 1, wherein the light source die comprises a laser die.

* * * * *